United States Patent
Rae et al.

(10) Patent No.: US 10,410,971 B2
(45) Date of Patent: Sep. 10, 2019

(54) THERMAL AND ELECTROMAGNETIC INTERFERENCE SHIELDING FOR DIE EMBEDDED IN PACKAGE SUBSTRATE

(71) Applicant: QUALCOMM Incorporated, San Diego, CA (US)

(72) Inventors: David Fraser Rae, San Diego, CA (US); Hong Bok We, San Diego, CA (US); Christopher Healy, San Diego, CA (US); Chin-Kwan Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/689,967

(22) Filed: Aug. 29, 2017

(65) Prior Publication Data
US 2019/0067205 A1 Feb. 28, 2019

(51) Int. Cl.
*H01L 23/13* (2006.01)
*H01L 23/552* (2006.01)
(Continued)

(52) U.S. Cl.
CPC ...... *H01L 23/552* (2013.01); *H01L 21/32051* (2013.01); *H01L 21/486* (2013.01); *H01L 21/4857* (2013.01); *H01L 23/13* (2013.01); *H01L 23/3735* (2013.01); *H01L 23/49811* (2013.01); *H01L 23/49822* (2013.01); *H01L 23/49827* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/81* (2013.01); *H01L 23/367* (2013.01); *H01L 24/16* (2013.01); *H01L 24/32* (2013.01); *H01L 24/73* (2013.01); *H01L 24/92* (2013.01); *H01L 2224/04105* (2013.01); *H01L 2224/12105* (2013.01); *H01L 2224/16225* (2013.01); *H01L 2224/16227* (2013.01); *H01L 2224/32225* (2013.01);
(Continued)

(58) Field of Classification Search
CPC ........... H01L 31/0203; H01L 31/02002; H01L 31/02325; H01L 31/02327; H01L 31/12; H01L 31/18; H01L 33/483; B29C 45/14065; B29C 45/14639; B29C 45/14778
USPC ........ 257/704, 748, 758, 788, 790; 438/112, 438/114, 125, 126, 127
See application file for complete search history.

(56) References Cited

U.S. PATENT DOCUMENTS 6,919,631 B1 * 7/2005 Hoffman ............. H01L 23/3128
257/707
8,492,888 B2 7/2013 Chi et al.
(Continued)

*Primary Examiner* — Long K Tran
(74) *Attorney, Agent, or Firm* — Loza & Loza, LLP/Qualcomm

(57) ABSTRACT

A package that includes an integrated device partially enclosed in a conductive material and embedded in a package substrate. The package includes a package substrate having a first cavity, the integrated device having a first active side and an inactive side embedded in the first cavity, and a structure partially enclosing the integrated device having a first layer and a second layer, wherein the first layer is coupled between the package substrate and the integrated device, and wherein the second layer is disposed over the inactive side of the integrated device.

30 Claims, 11 Drawing Sheets

(51) Int. Cl.
  *H01L 23/538* (2006.01)
  *H01L 21/48* (2006.01)
  *H01L 23/00* (2006.01)
  *H01L 21/3205* (2006.01)
  *H01L 23/373* (2006.01)
  *H01L 23/498* (2006.01)
  H01L 23/367 (2006.01)

(52) U.S. Cl.
  CPC ............... *H01L 2224/32245* (2013.01); *H01L 2224/73204* (2013.01); *H01L 2224/73253* (2013.01); *H01L 2224/81191* (2013.01); *H01L 2224/92125* (2013.01); *H01L 2224/94* (2013.01); *H01L 2224/96* (2013.01); *H01L 2924/1533* (2013.01); *H01L 2924/15311* (2013.01); *H01L 2924/3025* (2013.01); *H01L 2924/3511* (2013.01)

(56) References Cited

U.S. PATENT DOCUMENTS

| | | |
|---|---|---|
| 8,907,498 B2 | 12/2014 | Pagaila et al. |
| 9,337,073 B2 | 5/2016 | Liu et al. |
| 9,355,985 B2 | 5/2016 | Vincent et al. |
| 2012/0119346 A1* | 5/2012 | Im .................... H01L 21/563 257/690 |
| 2016/0276307 A1 | 9/2016 | Lin |

* cited by examiner

THERMAL AND ELECTROMAGNETIC INTERFERENCE SHIELDING FOR DIE EMBEDDED IN PACKAGE SUBSTRATE

BACKGROUND

Field

The present disclosure is in the field of integrated circuits. More specifically, the present disclosure involves heat dissipation and electromagnetic interference (EMI) shielding mechanisms for a die embedded in a package substrate.

Background

Integrated circuits are the cornerstone of most modern day electronic devices. Integrated circuits are a microscopic array of electronic circuits and components made together or integrated; hence the name. Initially, integrated circuits held only a few devices, probably as many as ten diodes, transistors, resistors and capacitors that allow the integrated circuit to fabricate one or more logic gates. Today, very-large-scale integration (VLSI) has created integrated circuits with millions of gates and hundreds of millions of individual transistors. Integrated circuits are found in devices such as computers and cellular phones. Over the years, scientists have significantly reduced the size of integrated circuits. In turn, these smaller integrated circuits bring about smaller electronic devices. The decrease in size of integrated circuits over the years has been so dramatic that to decrease their size even further is made difficult by physical limitations found at micro- and nanometer levels.

Usually, integrated circuits are produced on a single wafer of electronic grade silicon and then cut into pieces. Each piece represents a copy of the circuit and is called a die. An integrated circuit package generally refers to the die mounted within a protective housing where conductive input/output (I/O) pads of the die connect to external pins or pads (e.g., ball grid array packages) using bond wires or conductive pillars. The protective housing typically does not offer heat dissipation and EMI shielding mechanisms for the die. Consequently, there is a need for a method and associated apparatus for protecting the die from the damaging effects of heat and EMI.

SUMMARY

The present disclosure solves the problems of interference from heat and electromagnetic fields around a die embedded in a package substrate. Specifically, a conductive structure for absorbing and dissipating heat as well as surrounding electromagnetic fields is formed within the package substrate such that it partially surrounds the inactive sides of the die and couples to a grounding plane or chassis. The conductive structure provides the added benefit of supporting structural stability of the integrated circuit package, including maintaining the position of the die and the surrounding package substrate, as well as reducing stress on the solder joints of both the die and any surrounding elements. Furthermore, by embedding the die and the conductive structure in the package substrate, a circuit can be fabricated that is more robust than existing circuits that enclose the die in a molding material or compound via an encapsulation process.

One example provides a package, including a package substrate including a first cavity, an integrated device including a first active side and an inactive side, and embedded in the first cavity, and a structure partially enclosing the integrated device, the structure including a first layer and a second layer, wherein the first layer is coupled between the package substrate and the integrated device, and wherein the second layer is disposed over the inactive side of the integrated device. In one aspect, the first layer and the second layer include a conductive material. In another aspect, at least one of the first layer and the second layer is coupled to an electrical ground or a chassis ground. In another aspect, the conductive material includes one or more of a copper material or a conductive polymer. In another aspect, the integrated device includes a die having a second active side and the inactive side, a plurality of conductive pillars electrically coupled to elements on the second active side of the die and extending perpendicular therefrom, and a layer of dielectric material disposed over the second active side of the die and coupled to the plurality of conductive pillars. In another aspect, the second layer extends over a first surface of the package substrate, wherein the first surface is outside of the first cavity. In another aspect, the first layer is coupled to the second layer. In another aspect, the integrated device is embedded in the first cavity such that a gap exists between at least (i) a first side of the integrated device and a corresponding first side of the first cavity and (ii) a second side of the integrated device and a corresponding second side of the first cavity. In another aspect, the package substrate includes a prepreg substrate printed circuit board (PCB). In another aspect, the package includes a second cavity in at least a first side and a second side of the first cavity, and a third layer of conductive material contained within the second cavity. In another aspect, the third layer of conductive material is coupled to the first layer. In another aspect, the package includes a redistribution layer (RDL) coupled to the first active side of the integrated device. In another aspect, the first layer is coupled to at least one of an electrical ground and a chassis ground via a conductive line in the RDL.

Another example provides a package, including a package substrate including a first cavity and a second cavity, an integrated device including an active side and an inactive side, and embedded in the first cavity, and a structure partially enclosing the integrated device, the structure including a first layer, a second layer, and a third layer, wherein the first layer is coupled between the package substrate and the integrated device, wherein the second layer is disposed over the inactive side of the integrated device, and wherein the third layer is embedded in the second cavity. In one aspect, the third layer is coupled to the first layer. In another aspect, the first layer, the second layer, and the third layer are electrically coupled to at least one of an electrical ground and a chassis ground.

Another example provides a package, including a package substrate including at least a first cavity, an integrated device including a first active side and an inactive side, and embedded in the first cavity, a structure partially enclosing the integrated device, the structure including at least a first layer and a second layer, wherein the first layer is coupled between the package substrate and the integrated device, and wherein the second layer is disposed over the inactive side of the integrated device, and a layer of insulating material disposed between the structure and the integrated device. In one aspect, the integrated device includes a die having a second active side and the inactive side, a plurality of conductive pillars electrically coupled to elements on the second active side of the integrated device and extending perpendicular therefrom, and a layer of dielectric material disposed over the second active side and coupled to the plurality of conductive pillars, wherein the layer of insulating material is disposed over one or more of the inactive side, the plurality of conductive pillars, or the layer of dielectric material. In another aspect, the package substrate includes a second cavity, and wherein the structure further includes a third layer contained within the second cavity. In another aspect, the third layer is coupled to the first layer. Another aspect includes a redistribution layer (RDL) coupled to the first active side of the integrated device. Another aspect includes the first layer coupled to at least one of an electrical ground and a chassis ground via a conductive line in the RDL.

Another example provides a method of fabricating a package, the method including forming a first cavity in a package substrate, depositing an integrated device into the first cavity, the integrated device having an active side and an inactive side, and disposing a first layer of conductive material and a second layer of conductive material about the integrated device such that the integrated device is partially enclosed in the conductive material, wherein the first layer of conductive material is coupled between the package substrate and the integrated device, and wherein the second layer of conductive material is disposed over the inactive side of the integrated device. In one aspect, depositing the integrated device into the first cavity further includes positioning the integrated device in the first cavity such that a gap exists between at least (i) a first side of the integrated device and a corresponding first side of the first cavity and (ii) a second side of the integrated device and a corresponding second side of the first cavity. In another aspect, disposing the first layer of conductive material and the second layer of conductive material about the integrated device further includes depositing a first seed layer over (i) the first side of the integrated device and the corresponding side of the first cavity and (ii) a second side of the integrated device and the corresponding side of the first cavity, depositing a second seed layer over the inactive side of the integrated device, forming the first layer of conductive material utilizing the first seed layer, and forming the second layer of conductive material utilizing the second seed layer. Another aspect includes first seed layer and the second seed layer including a conductive metal. Another aspect includes forming a second cavity in the package substrate of at least a first side and a second side of the first cavity, and filling the second cavity in the package substrate with a third layer of conductive material. Another aspect includes the third layer of conductive material is coupled to the first layer of conductive material.

DETAILED DESCRIPTION

In the following description, specific details are given to provide a thorough understanding of the described implementations. However, it will be understood by one of ordinary skill in the art that the implementations may be practiced without these specific details. For example, circuits may be shown in block diagrams or in a simplified representation in order not to obscure the implementations in unnecessary detail. In other instances, well-known circuits, structures, and techniques may be shown in detail in order not to obscure the implementations.

Figure 1:
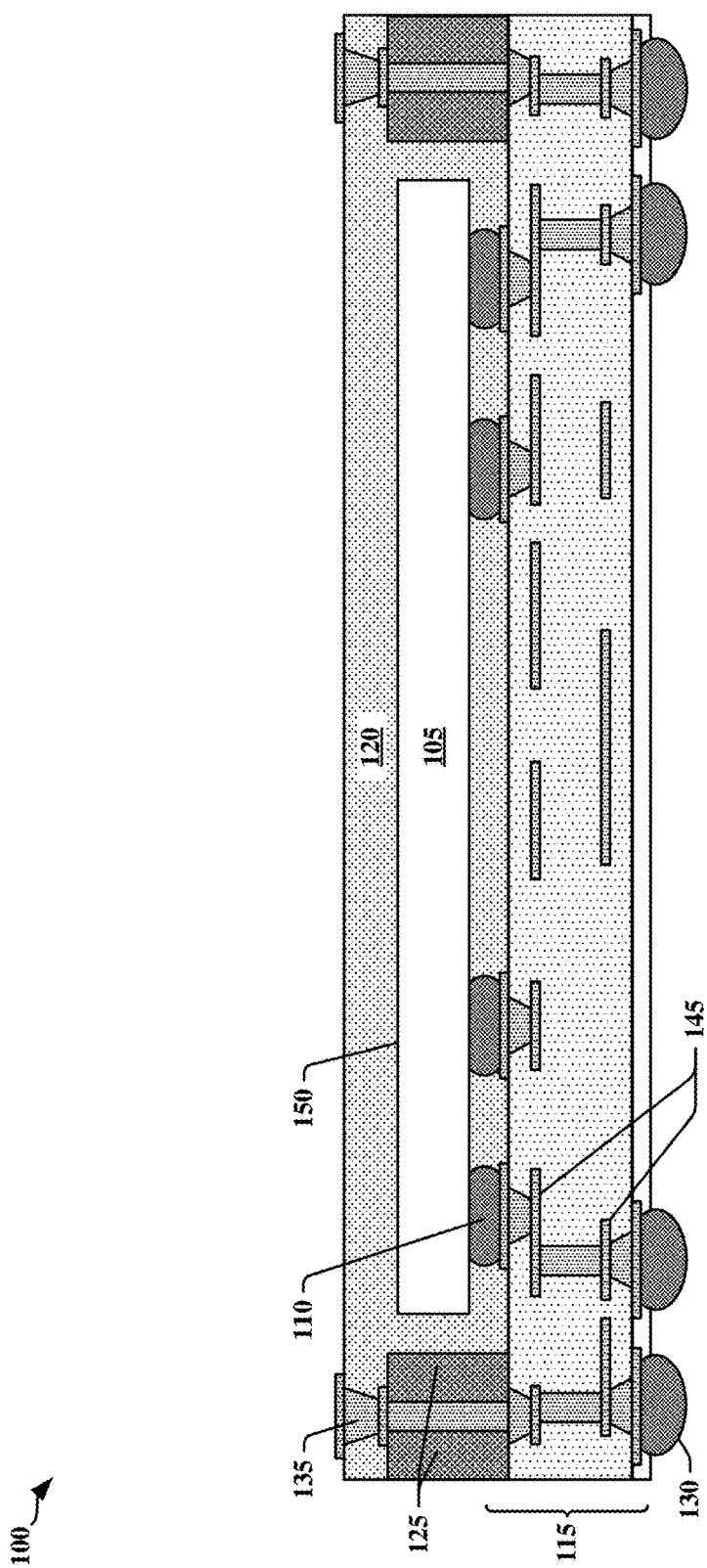
FIG. 1 illustrates a cross-sectional view of an exemplary integrated circuit package with an embedded die.

FIG. 1 illustrates a cross-sectional view of an exemplary integrated circuit package 100 with an embedded integrated device, or in this example, a die 105. The die 105 is surrounded by a molding compound or dielectric material 120. Dies typically have only one active face. Consequently, electrical connections are made only to that active face. Here, the active face of the die 105 is connected to a redistribution layer (RDL) 115 via a plurality of conductive pillars 110, while the inactive side 150 of the die 105 is coated with the dielectric material 120.

A ball grid array (BGA) 130 provides a conductive array that interfaces with the die 105 via the RDL 115. The BGA 130 serves to couple, electrically and physically, the exemplary integrated circuit package 100 to any external device or circuitry, such as a motherboard of an electronic device (not shown). These integrated circuits often include small openings that contain conductive material to provide an electrical path around the die 105. These opening with conductive material are known as vias 135.

The materials used to surround or encapsulate the die 105 are important. The RDL 115 and conductive pillars 110 pass electrical signals to the die 105, generating a fair amount of heat. However, the die 105 itself can generate a significant amount of heat during operation which can cause warping of the dielectric material 120 and compromise the structural integrity of the circuit.

Exemplary Two-Layer Core

Figure 2:
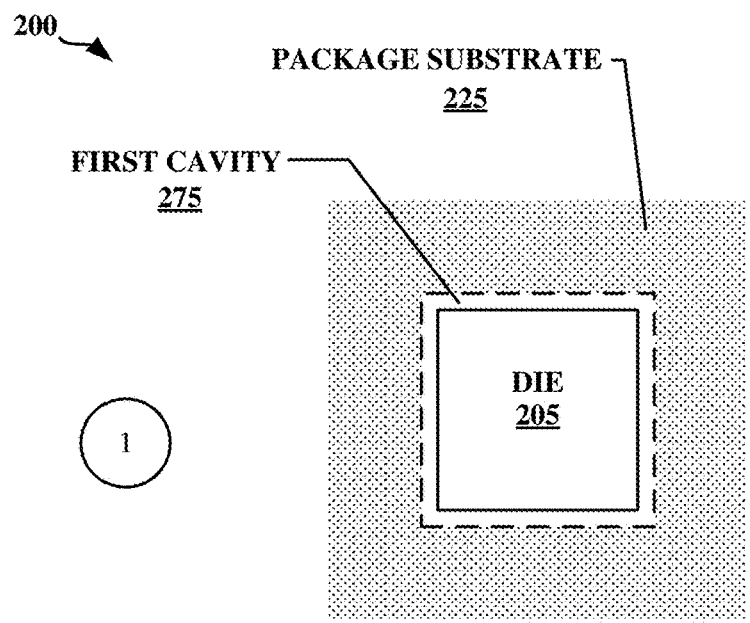
FIG. 2 illustrates a plan view of an exemplary integrated circuit package that includes a first cavity in a package substrate, where the cavity holds a die and a die enclosure.
Figure 2:
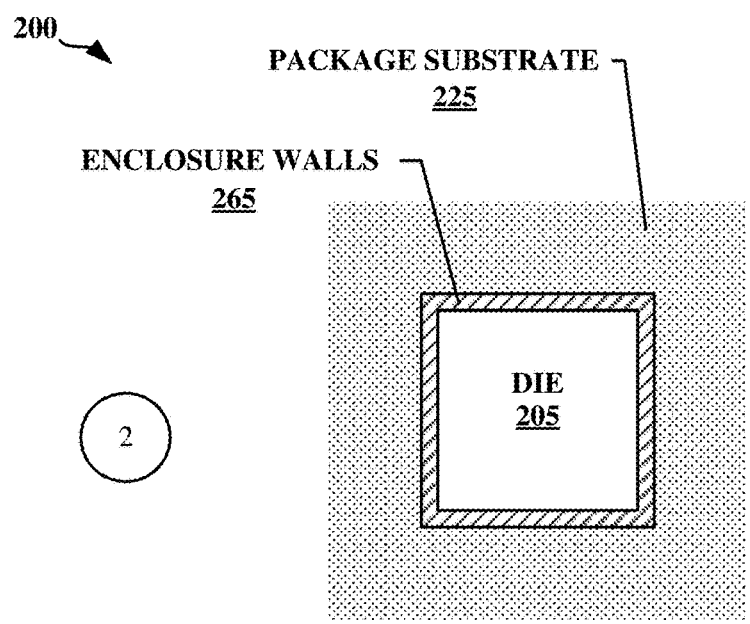

FIG. 2 illustrates a plan view of an exemplary integrated circuit package 200 that includes a first cavity 275 in a package substrate 225, where the first cavity 275 holds an integrated device, or in this example, a die 205 and a two-layer core die enclosure 355. FIG. 2 includes two numerically sequenced example stages of fabrication of the exemplary integrated circuit package 200. It should be noted that FIG. 2 is limited to two stages in order to provide a simplified example for fabricating the integrated circuit package 200. The first stage of FIG. 2 (demarcated numeral 1) includes the package substrate 225, the first cavity 275, and the die 205. As shown in the first figure, the first cavity 275 is one contiguous cavity formed in the package substrate 225. The walls of the first cavity 275 laterally surround the die 205. In another example, a space, or gap, exists between at least one of the walls of the first cavity 275 and the die 205. In such an example, the remaining walls of the first cavity 275 may be in direct contact with at least one side of the die 205.

The second stage of FIG. 2 (demarcated numeral 2) illustrates the integrated circuit package 200 includes the package substrate 225 wherein the space between the die 205 and the walls of the first cavity 275 are filled with a conductive material to form enclosure walls 265. The enclosure walls 265 can enclose the die 205 within the first cavity 275 formed in the package substrate 225. Exemplary materials of the enclosure walls 265 include copper material plating or a conductive polymer. However, other conductive and/or magnetic materials are contemplated, such as other metals, semiconductors, metal foam, metallic ink, conductive paste, and some nonmetallic conductors such as graphite, among others.

Still referring to the second stage of FIG. 2, the die 205 and/or the package substrate 225 can be overlaid with the conductive material that is the same or different from the material used for the enclosure walls 265. Although not shown in FIG. 2, the overlay can form an enclosure cover 360 shown in FIGS. 3, 4, 5, 6, 7, 8, and 11.

Figure 3:
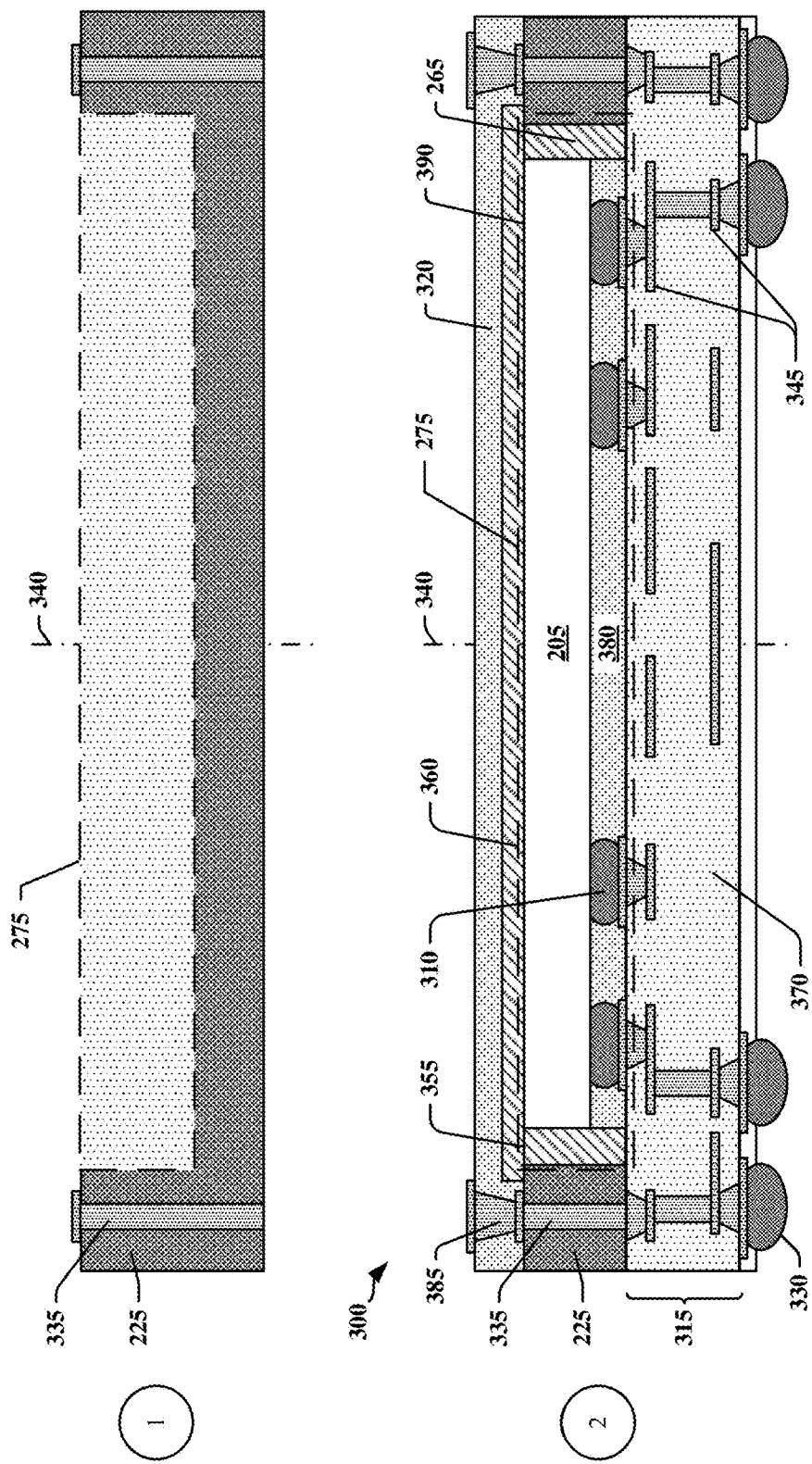
FIG. 3 illustrates a cross-sectional view of an exemplary integrated circuit package that includes the first cavity in the package substrate and the die of FIG. 2 partially enclosed in a conductive structure that includes two layers.

FIG. 3 illustrates a cross-sectional view of an exemplary integrated circuit package that includes the first cavity 275 in the package substrate 225 and the die 205 of FIG. 2 partially enclosed in a conductive structure that includes two layers. FIG. 3 includes two numerically sequenced stages of fabrication of the integrated circuit package 300. It should be noted that FIG. 3 is limited to two stages in order to provide a simplified example for fabricating the integrated circuit package 300. The first stage of FIG. 3 (demarcated numeral 1) shows the first cavity 275 formed in the package substrate 225. One or more vias 335 are shown in the package substrate 225 to provide a reference of the location of the first cavity 275 in the relation to the second stage of FIG. 3 (demarcated with numeral 2).

The second stage of FIG. 3 illustrates a fabricated integrated circuit package with a dashed line providing a reference to the location of the first cavity 275. The conductive structure is exemplified by the two-layer core enclosure 355 for the die 205 embedded in the first cavity 275 of the package substrate 225, or substrate core. Generally, the package substrate 225 provides structural support during subsequent processing steps, as well as after fabrication. The package substrate 225 may include any suitable material, for example, silicon based materials, such as a silicon wafer, glass or silicon oxide, or other materials, such as aluminum oxide, a ceramic material, combinations of any of these materials, or the like. In another example, the package substrate 225 may include a prepreg substrate printed circuit board (PCB) containing fiberglass or other fabric which has been saturated with polymer resin or epoxy (prepreg) and cured. In one example, the package substrate 225 is planar in order to accommodate further processing. The two-layer core enclosure 355 can enclose the die 205 within a first cavity 275 formed in the package substrate 225. Exemplary materials of the two-layer core enclosure 355 include copper plating or a conductive polymer. However, other conductive and/or magnetic materials are contemplated, such as other metals, semiconductors, metal foam, metallic ink, and some nonmetallic conductors such as graphite, among others. The two-layer core enclosure 355 may include the enclosure cover 360 and the enclosure walls 265. The enclosure walls 265 may also be referred to herein as a first layer, and the enclosure cover 360 may also be referred to herein as a second layer. Although referred to herein as a wall or enclosure walls 265, this piece of the two-layer core enclosure 355 may be formed using multiple pieces, such as pillars or layers. The two-layer core enclosure may be formed of conductive material.

As mentioned above, connections to dies are typically made on the die's active face. In integrated circuit package 300, connections to I/O pads on the active face of the die 205 are made via conductive pillars 310. The two-layer core enclosure 355, therefore, may be formed around one or more sides, and the inactive side 390, of the die 205, such that the two-layer enclosure is in direct or indirect contact with certain aspects of the die 205. The conductive pillars 310 may put a distance of separation between the die 205 and a redistribution layer (RDL) 315 such that the die 205 and RDL 315 are not in direct contact. Between the conductive pillars 310, and further separating the RDL 315 from the die 205, is a layer of dielectric material, an electrical insulator, or dielectric coating 380. The dielectric coating 380 conductively insulates the conductive pillars 310 and the two-layer core enclosure 355, while also providing structural support to the die 205 and conductive pillars 310.

The RDL 315 may include a plurality of conductive layers 345, or conductive lines, to make the I/O pads of the die 205 available in other locations. As such, the RDL 315 may be coupled to one or more of the conductive pillars 310. In one embodiment, one or more conductive layers 345 of the RDL 315 may be coupled to the two-layer core enclosure 355 such that the enclosure is electrically grounded to a chassis ground or another electrical ground path. In such a configuration, the two-layer core enclosure 355 functions as an EMI shield, reducing and eliminating radio waves, electromagnetic fields, and electrostatic fields around the die 205. Another advantage of this configuration includes transferring heat generated by the die 205 from the two-layer core enclosure 355 to the RDL 315. The heat is dissipated through the ground contacts of the RDL 315 layers, and also through the two-layer core enclosure 355. Heat generated by the die 205 can be trapped in the die 205 due to poor thermal dissipation properties of the material surrounding the die. The trapped heat causes warping of the materials surrounding the die 205, which results in additional stresses at solder joints located on the die 205 and on surrounding elements of the integrated circuit.

Another advantage of the present disclosure is in the structural properties of the two-layer core enclosure 355. For example, the two-layer core enclosure 355 may be symmetrical about a vertical axis 340. The symmetry of the enclosure reduces or eliminates any warping of material surrounding the die 205 by providing robust structural support, and by also uniformly dissipating heat generated by the die 205. In another example, the enclosure cover 360 and the enclosure walls 265 are deposited having a predetermined width of, for example, 50 to 200 microns (μm). By forming the two-layer core enclosure 355 in this manner, a relatively strong bond interface can be produced between the package substrate 225 and the die 205.

In one example, each wall of the enclosure walls 265 may be connected to one or more ground paths in the RDL 315. Each wall of the enclosure walls 265 may be located within the first cavity 275 of the package substrate 225 between, and direct contact with, the package substrate 225 and the die 205. Each wall of the enclosure walls 265 may be coupled to the enclosure cover 360, such that the two-layer core enclosure 355 is connected to the one or more ground paths in the RDL 315. In another example, each wall of the enclosure walls 265 may be substantially the same height as the walls of the first cavity 275 formed in the package substrate 225. In another example, the enclosure walls 265 may be shorter or taller than the height of the walls of the first cavity 275, depending on the real estate taken up on the integrated circuit package 300.

Still referring to the second stage of FIG. 3, the enclosure cover 360 may have a uniform thickness across the inactive side 390 of the die 205. The enclosure cover 360 may extend across, and adjacent to, the inactive side 390 of the die 205 and the enclosure walls 265 of the two-layer core enclosure 355. In one example, the inactive side 390 of the die 205 is positioned at substantially the same height as the top plane of the package substrate 225 outside of the first cavity 275, such that the lateral distance between the two is substantially zero. In this example, the enclosure cover 360 may extend across, and adjacent to, the inactive side 390 of the die 205, one or more of the enclosure walls 265 of the two-layer core enclosure 355, and the top plane of the package substrate 225 outside of the first cavity 275. The extent to which the enclosure cover 360 may extend across the top plane of the package substrate 225 can be limited by the placement of one or more vias 335. For example, a dielectric material 320, or dielectric lamination, may form a barrier between the enclosure cover 360 and the one or more vias 335. In another example, the enclosure cover 360 may extend across the top plane of the package substrate 225 such that the enclosure cover 360 is coupled to the one or more vias 335. In this example, the coupling is advantageous if the one or more vias 335 are also connected to a ground plane or chassis ground, such that a larger surface area is available for heat dissipation and EMI shielding.

In another example, the inactive side 390 of the die 205 may be positioned in the first cavity 275 such that the die 205 is below the top plane of the package substrate 225, creating a lateral distance between the die 205 and the top plane of the package substrate 225. In this example, the enclosure cover 360 may be limited to extending across, and adjacent to, the inactive side 390 of the die 205 and at least one of the enclosure walls 265 of the two-layer core enclosure 355. In such a configuration, the top of the enclosure cover 360 may be substantially planar with top plane of the package substrate 225.

Exemplary Three-Layer Core

Figure 4:
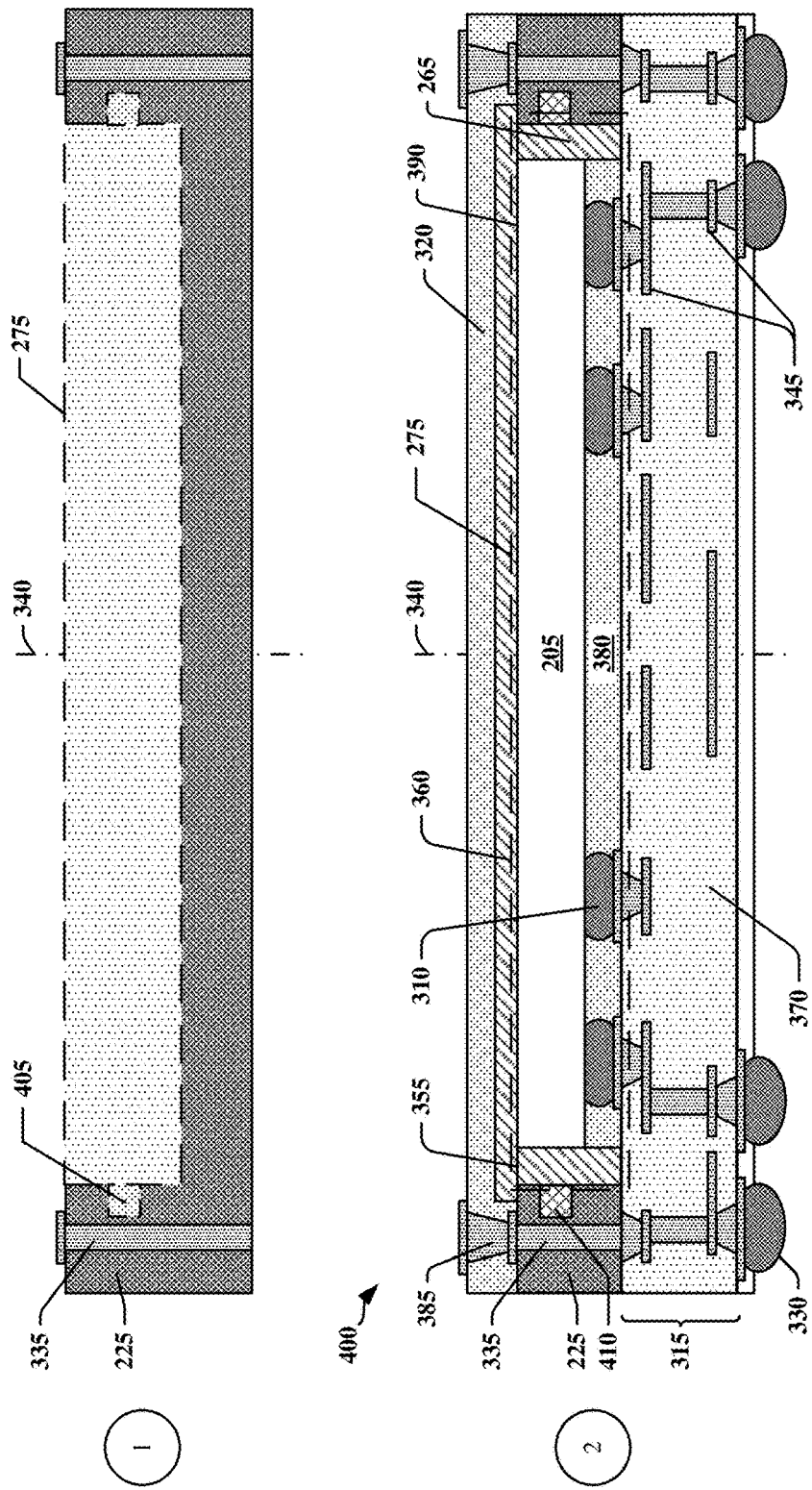
FIG. 4 illustrates a cross-sectional view of an exemplary integrated circuit package that includes the first cavity in the package substrate and the die of FIG. 2, and a second cavity in the package substrate, the die partially enclosed in a conductive structure that includes three layers.

FIG. 4 illustrates a cross-sectional view of an exemplary integrated circuit package that includes the first cavity 275 in the package substrate 225 and the die of FIG. 2, and a second cavity 405 in the package substrate 225, the die partially enclosed in a conductive structure that includes three layers. FIG. 4 includes two numerically sequenced stages of fabrication of the integrated circuit package 400. The first stage of FIG. 4 (demarcated numeral 1) shows the first cavity 275 and a pair of second cavities (or simply, "the second cavity 405") formed in the package substrate 225. One or more vias 335 are shown in the package substrate 225 to provide a reference of the location of the first cavity 275 and the second cavity 405 in relation to the second stage of FIG. 4 (demarcated with numeral 2).

The second stage of FIG. 4 illustrates a fabricated integrated circuit package with a dashed line providing a reference to the location of the first cavity. The conductive structure is exemplified by a three-layer core enclosure (355, 410). The three-layer core enclosure (355, 410) is a modified embodiment of the two-layer core enclosure 355 that includes a third layer 410 of conductive material embedded within the second cavity 405 of the package substrate 225. The three-layer core enclosure (355, 410) can enclose the die 205 within a second cavity 405 formed in the package substrate 225. Exemplary materials of a third layer 410 of conductive material, or the third layer 410, include copper plating or a conductive polymer. However, other conductive and/or magnetic materials are contemplated, such as other metals, semiconductors, metal foam, metallic ink, and some nonmetallic conductors such as graphite, among others. The third layer 410 may have a predetermined width of, for example, 25 to 200 μm. By forming the third layer 410 in this manner, a relatively strong bond interface can be produced between the package substrate 225 and the die 205.

The third layer 410 may include a layer of material embedded in the second cavity 405 of the package substrate 225 that is in addition to the enclosure cover 360 and the enclosure walls 265 of the two-layer core that are embedded in the first cavity 275. In one example, the third layer 410 may be coupled to one or more of the plurality of walls of the enclosure walls 265, and/or the enclosure cover 360. In this example, the three-layer core enclosure (355, 410) may be grounded via the enclosure cover 360 and/or enclosure walls 265 being coupled to a grounding plane or chassis. In one example, the third layer 410 may be coupled to one or more vias 335. In this example, the vias 335 may be coupled to a grounding plane or chassis, thereby effectively grounding the three-layer core enclosure (355, 410). Although this disclosure defines the two-layer core enclosure 355 and the three-layer core enclosure (355, 410), additionally layers are contemplated.

Additional Embodiments

Figure 5:
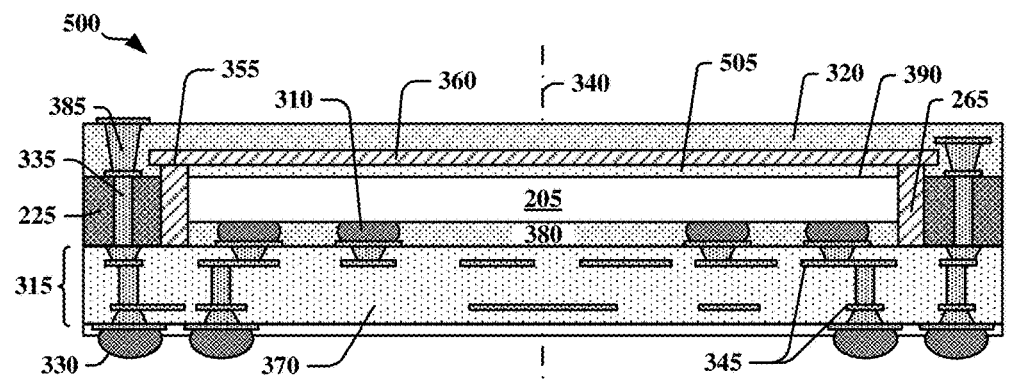
FIG. 5 illustrates a cross-sectional view of an exemplary integrated circuit package that includes the die of FIG. 2 partially enclosed in the conductive structure of FIG. 3 and an additional layer of material between the die and the conductive structure.

FIG. 5 illustrates a cross-sectional view of an exemplary integrated circuit package 500 that includes the die 205 of FIG. 2 partially enclosed in the conductive structure of FIG. 3 and an additional layer of material between the die and the conductive structure. In this example, the die 205 may have a layer of insulating material, or a first insulating layer 505, distributed between the enclosure cover 360 and the top, or inactive side 390, of the die 205. The first insulating layer 505 may include a non-conductive or semi-conductive material, for example, a mold compound, polymer, ceramic, or glass. In a manufacturing or fabrication stage, the top of the die 205 may be coated with the first insulating layer 505 using any of the material coating and/or distribution processes disclosed herein.

Figure 6:
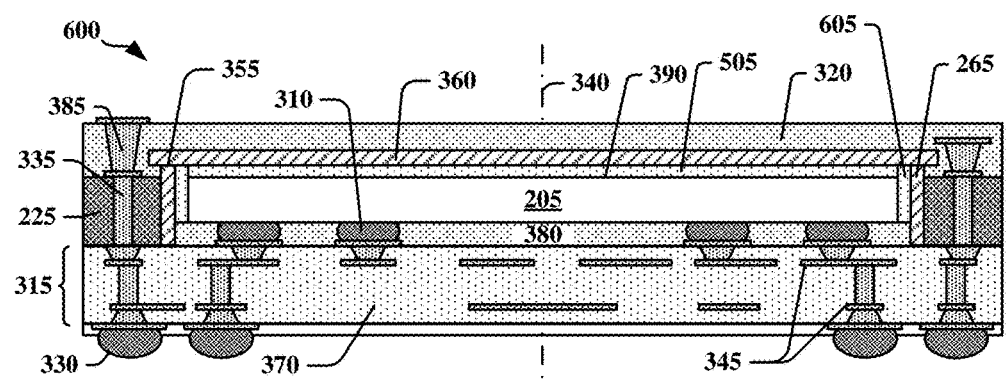
FIG. 6 illustrates a cross-sectional view of an exemplary integrated circuit package that includes the die of FIG. 2 partially enclosed in the conductive structure of FIG. 3 and an additional three layers of material between the die and the conductive structure.

FIG. 6 illustrates a cross-sectional view of an exemplary integrated circuit package 600 that includes the die 205 of FIG. 2 partially enclosed in the conductive structure of FIG. 3 and an additional three layers of material between the die and the conductive structure. In this example, the die 205 may have a first insulating layer 505 distributed between the enclosure cover 360 and the top, or inactive side 390, of the die 205, as well as a second insulating layer 605 distributed between the die 205 and the enclosure walls 265. The first insulating layer 505 and the second insulating layer 605 may include a non-conductive or semi-conductive material, for example, a mold compound, polymer, ceramic, or glass. In a manufacturing or fabrication stage, the sides of the die 205 may be coated with the second insulating layer 605 using any of the material coating and/or distribution processes disclosed herein.

Figure 7:
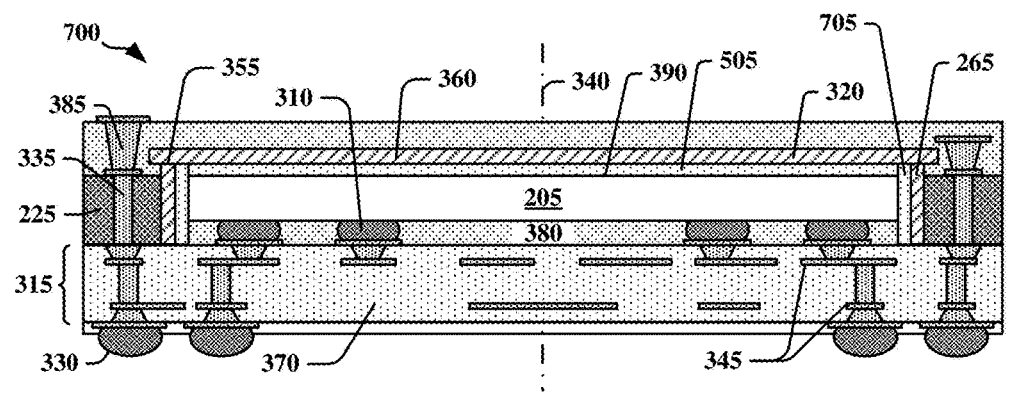
FIG. 7 illustrates a cross-sectional view of an exemplary integrated circuit package that includes the die of FIG. 2 partially enclosed in the conductive structure of FIG. 3 and an additional three layers of material between the die, the conductive structure, and an electrical insulator.

FIG. 7 illustrates a cross-sectional view of an exemplary integrated circuit package 700 that includes the die 205 of FIG. 2 partially enclosed in the conductive structure of FIG. 3 and an additional three layers of material between the die 205, the conductive structure, and the dielectric coating 380. In this example, the die 205 may have a first insulating layer 505 distributed between the enclosure cover 360 and the top, or inactive side 390, of the die 205, as well as a third insulating layer 705 distributed between the die 205, dielectric coating 380, and the enclosure walls 265, such that the third insulating layer 705 is bounded by the RDL 315 at the bottom and the enclosure cover 360 at the top. The first insulating layer 505 and the third insulating layer 705 may include a non-conductive or semi-conductive material, for example, a mold compound, polymer, ceramic, or glass. In a manufacturing or fabrication stage, the sides of the die 205 and dielectric coating 380 may be coated with the third insulating layer 705 using any of the material coating and/or distribution processes disclosed herein.

Figure 8:
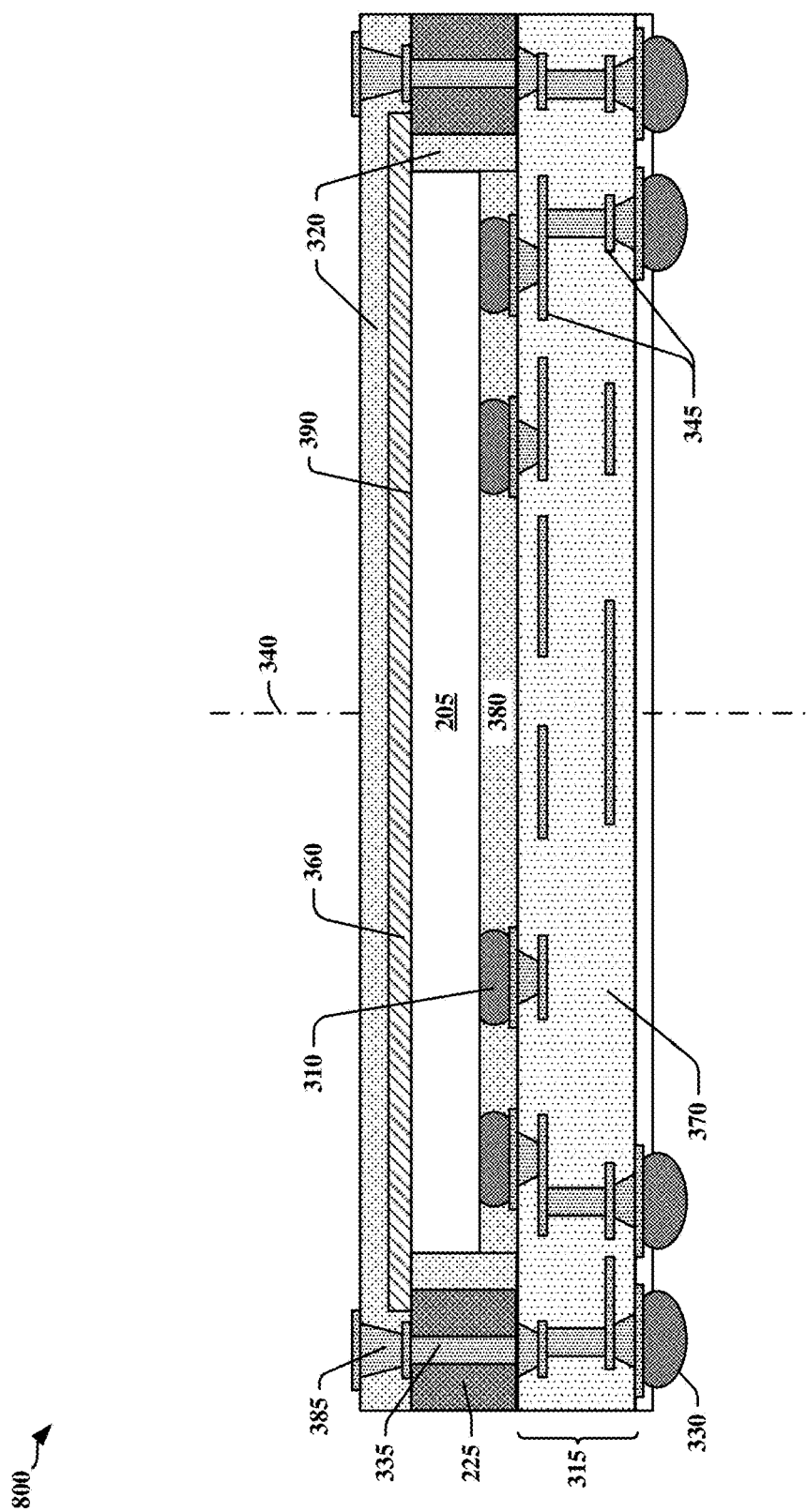
FIG. 8 illustrates a cross-sectional view of an exemplary integrated circuit package that includes the die of FIG. 2 partially enclosed in a conductive structure that includes an enclosure cover.

FIG. 8 illustrates a cross-sectional view of an exemplary integrated circuit package 800 that includes the die 205 of FIG. 2 partially enclosed in a conductive structure that includes an enclosure cover 360. In this example, the die 205 may already have a dielectric coating 380 that fills the gaps between the conductive pillars 310 and fills the space between the active face of the die 205 and the RDL 315. An amount of dielectric material 320 may fill the space between the walls of the die 205 and the walls of the first cavity 275, such that the die 205 is stabilized in the first cavity 275. In this example, the enclosure cover 360 may be distributed over the top, or inactive side 390, of the die 205 such that the enclosure cover 360 is in direct contact with the inactive side 390 of the die 205. As also shown in FIGS. 3 and 4, the inactive side 390 of the die 205 may have a zero lateral distance from the top side of the package substrate 225. The enclosure cover may be distributed over the top of the die 205 and a portion of the top of the package substrate 225. In another example, both the top of the die 205 and the package substrate 225 may be completely covered.

Figure 9:
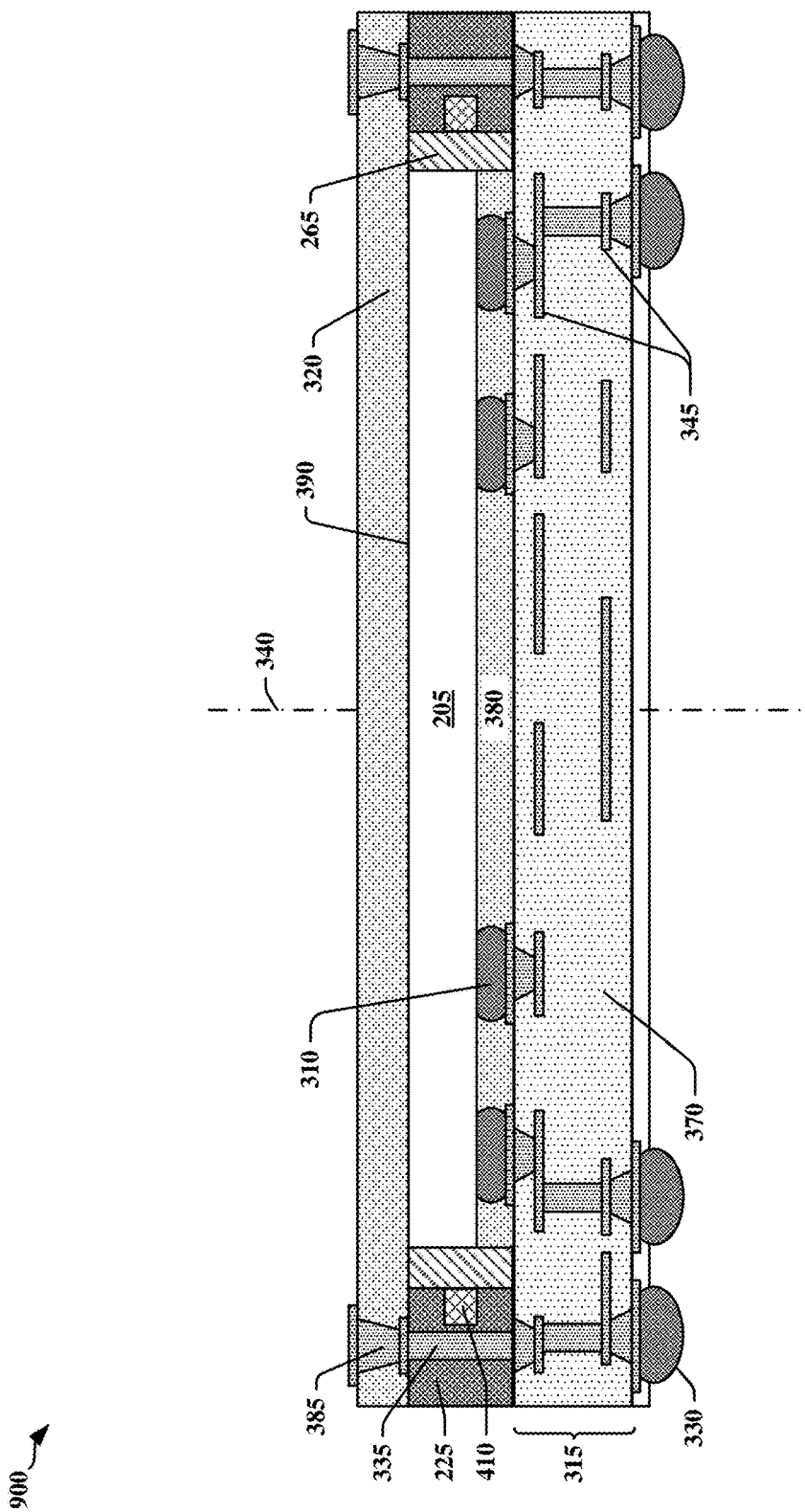
FIG. 9 illustrates a cross-sectional view of an exemplary integrated circuit package that includes the die of FIG. 2 partially enclosed in a conductive structure that includes at least two side layers.

FIG. 9 illustrates a cross-sectional view of an exemplary integrated circuit package 900 that includes the die 205 of FIG. 2 partially enclosed in a conductive structure that includes at least two side layers. The conductive structure is exemplified by the enclosure walls 265, and the optional third layer 410. In this example, the enclosure walls 265 and the optional third layer 410 can be formed between one or more walls of the first and/or second cavity 405 and sides of the die 205. In one embodiment, the third layer 410 may be tied to an electrical ground by a coupling of the third layer 410 to the vias 335. Such an example may be beneficial when the inactive side 390 of the die 205, or top of the die 205, generates or receives radio frequency (RF) transmissions which may be affected if the die 205 were embedded in the package substrate 225 and substantially covered with the enclosure cover 360.

Exemplary Process for Fabrication

Figure 10:
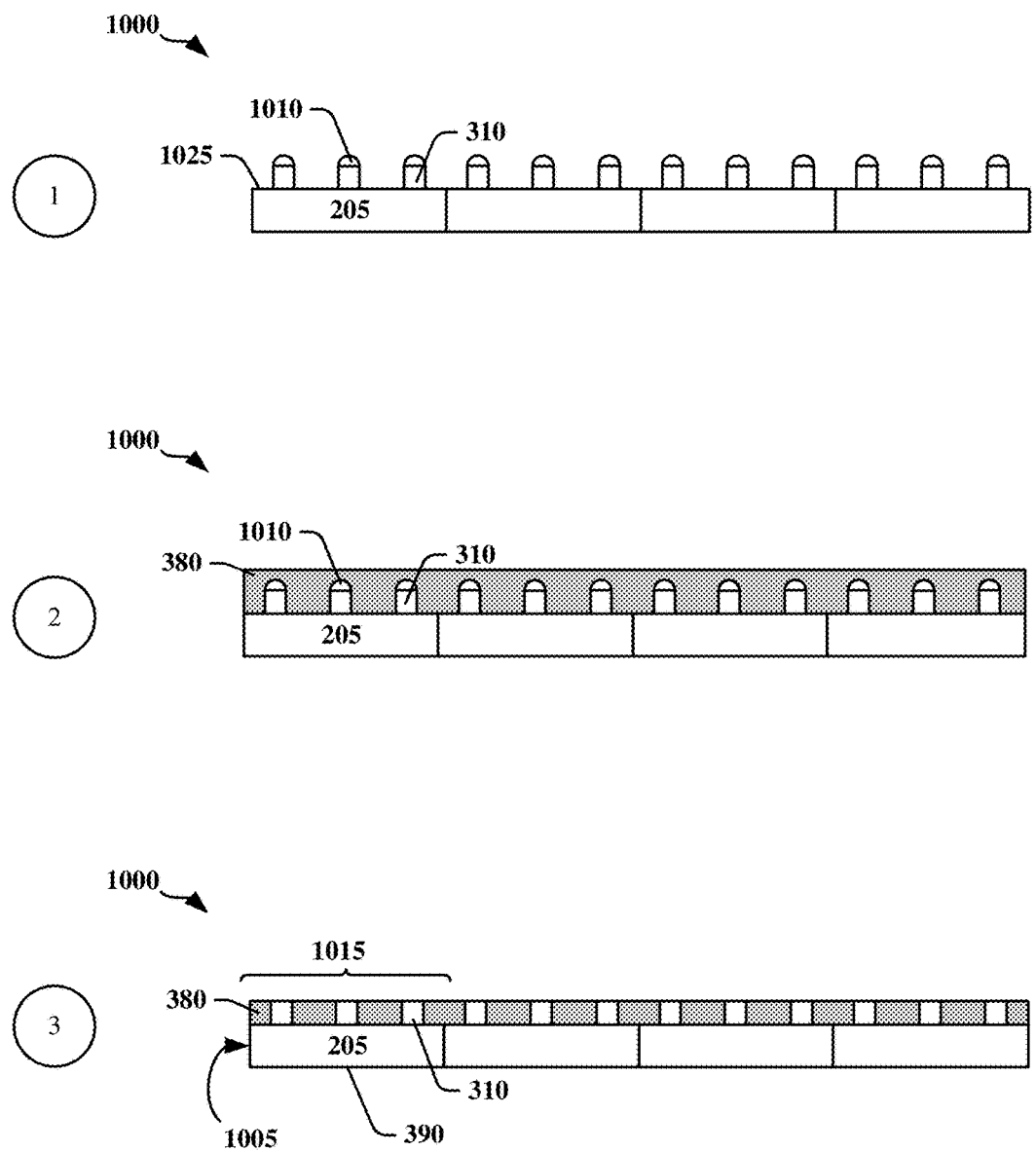
FIG. 10 illustrates a series of exemplary fabrication steps for preparing a die package using the die of FIG. 2.

FIG. 10 illustrates a series of exemplary fabrication steps for preparing a die package 1005 using the die 205 of FIG. 2. FIG. 10 includes three numerically sequenced stages of fabrication in an example method for preparing a die package 1005 to be embedded in the package substrate 225 according to the disclosure herein. It should be noted that the method of fabricating illustrated in FIG. 10 is limited to three stages in order to provide a simplified example for fabricating the die package 1005. A first stage of FIG. 10 (demarcated numeral 1) illustrates an example array of dies 1000 where conductive pillars 310 are applied to the active side of the array of dies 1000 using an electroplating process. The conductive pillars 310 can be formed on each die 205 using a copper seed layer with photoresist defining the diameter of each conductive pillar 310 and pillar cap 1010 such that each pillar extends substantially perpendicular therefrom. Each conductive pillar 310 may include the pillar cap 1010 made of a conductive metal or other material. In one example, a dielectric coating 380 can be applied to the active surface of the die 205 such that it surrounds and covers the conductive pillars 310 and pillar caps 1010.

A second stage of FIG. 10 (demarcated numeral 2) illustrates the array of dies 1000 with the conductive pillars 310 and pillar caps 1010, and with the dielectric coating 380 formed over the active face of each die 205 and around the conductive pillars 310, filling any gaps between the pillars. The top surface of the dielectric coating 380 can be higher than the top ends of the conductive pillars 310 and pillar caps 1010. In one example, dielectric coating 380 is a planar layer having a substantially uniform thickness. The dielectric coating 380 materials may include a polymer, such as polybenzoxazole (PBO) and bisbenzocyclotene (BCB), a molding compound, a molding underfill, an epoxy, or a resin. The dielectric coating 380 can be used as surface protective layer for the die, or as component isolation layer between micro circuits. The dielectric coating 380 also protects the die 205 and the conductive pillars 310 from stress caused by etching, delamination, and grinding. Next, a grinding step is performed to thin the dielectric coating 380 and expose the conductive pillars 310 to create a first active side 1015 of the die package 1005.

A third stage of FIG. 10 (demarcated numeral 3) illustrates the array of dies 1000 as a plurality of die packages 1005, each with exposed conductive pillars 310 after grinding to create the first active side 1015 of the die package 1005. The first active side 1015 refers to a side of the die package 1005 that can be electrically active or conductive, whereas a second active side 1025 may refer to an electrically active or conductive side of the die 205 itself, and to which the conductive pillars and dielectric coating are coupled. In contrast, the inactive side 390 of the die may not be electrically active or conductive. As a result of the grinding, metal residues such as metal particles may be generated, and left on the top surfaces. Accordingly, after the grinding, a cleaning may be performed, for example, a wet etching, so that the metal residue is removed.

Figure 11:
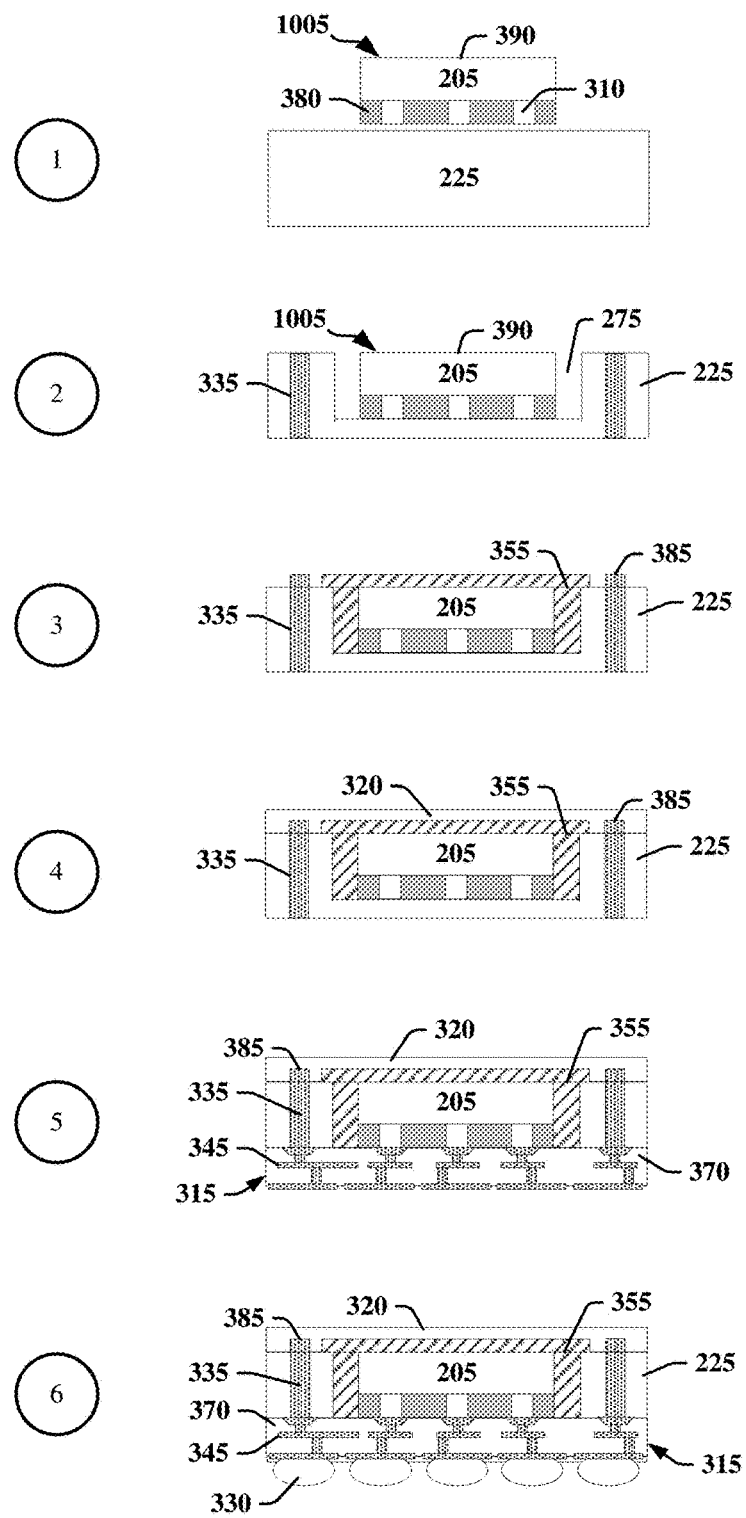
FIG. 11 illustrates a series of exemplary fabrication steps for embedding the die package of FIG. 10 in a package substrate.

FIG. 11 illustrates a series of exemplary fabrication steps for embedding the integrated device, or in this example, the die package 1005 of FIG. 10 in the package substrate 225. FIG. 11 includes six numerically sequenced stages of fabrication for embedding the die package 1005 into the package substrate 225. It should be noted that the method of fabricating illustrated in FIG. 11 is limited to six stages in order to provide a simplified example for fabricating the integrated circuit package 200. The first stage of FIG. 11 illustrates the die package 1005 and the package substrate 225.

A second stage of FIG. 11 (demarcated with a numeral 2) illustrates the die package 1005 positioned inside of the first cavity 275 formed in the package substrate 225. The package substrate 225 can also be prepared to include a plurality of vias 335 and via caps 385. The first cavity 275 can be formed in the package substrate 225 using a drilling or milling approach. In one example, the first cavity 275 can be formed using a laser drill. Laser drilling offers high precision and positional accuracy relative to milling. The laser drill can be precisely controlled to achieve a uniform depth and dimension of the first cavity 275. The laser drill may use a wavelength large enough to protect extant copper layers in the package substrate 225. In another example, copper layers can be added to establishing a "stop layer" to aid in the process of forming the first cavity 275. In another example, the first cavity 275 may be formed using a milling approach. In this example, the die package 1005 is deposited into the first cavity 275 such that the active side of the die package 1005 is in contact with the bottom of the first cavity 275, and the surface of the inactive side 390 of the die package 1005 is substantially level with the top surface of the package substrate 225. A depth of the first cavity 275 may be between approximately 100 and 950 μm. It is appreciated, however, that the values recited throughout the description are examples, and may be changed to different values.

Still referring to the second stage of FIG. 11, the first cavity 275 may have a volume that is greater than the volume of the die package 1005. In other words, the first cavity 275 has a length dimension, a width dimension, and a height dimension. At least one dimension of the first cavity 275 is greater than the corresponding dimension of the die package 1005. Any remaining dimensions may be greater than or at least equal to the corresponding dimensions of the die package 1005. The dimensions of the first cavity 275 may be bounded by the package substrate 225 material on at least one side. For example, the first cavity 275 may be formed in a layer of the package substrate 225 material such that the first cavity 275 has four walls and a floor of the package substrate 225 material. In another example, the first cavity 275 may only include two walls and a floor. In yet another example, the height dimension of the die package 1005 may be greater than the height dimension of the first cavity 275. This arrangement may provide spatial benefits when the real estate beneath the die 205 is needed for other connections.

Still referring to FIG. 11, a third stage (demarcated with a numeral 3) illustrates the die package 1005 encapsulated in the two-layer core enclosure 355 within the package substrate 225. The two-layer core enclosure 355 may include an enclosure cover 360 and an enclosure wall. The two-layer core enclosure 355 may be formed utilizing a seed layer (not shown). For example, by depositing the seed layer over the package substrate 225, the vias 335, the die package 1005, and in the remaining space of the first cavity 275. In some embodiments, the seed layer is a metal layer, which may be a single layer or a composite layer that includes a plurality of sub-layers formed of different materials. In some embodiments, the seed layer includes a titanium layer and a copper layer over the titanium layer. The seed layer may be formed using, for example, physical vapor deposition (PVD), or the like. In one example, a first seed layer is deposited over the sides of the die package 1005 and the corresponding sides of the first cavity 275. A second seed layer is deposited over the inactive side 390 of the die package 1005. A mask layer is then formed and patterned on the seed layer in accordance with a desired redistribution pattern.

In some embodiments, the mask is a dry film resist lamination, or photoresist formed by spin coating or the like and exposed to light for patterning. The patterning forms openings through the mask to expose the seed layer. The two-layer core enclosure 355 is formed in the openings of the mask and on the exposed portions of the seed layer. In addition to the two-layer core enclosure 355, via caps 385 can be formed to extend vias 335. The two-layer core enclosure 355 may be formed by plating, such as electroplating or electroless plating, or the like. The two-layer core enclosure 355 may include a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The two-layer core enclosure 355 operates as a passive heat sink to the die 205, as well as operating as an EMI shield to reduce or eliminate the electromagnetic field in the space surrounding the die 205. The two-layer core enclosure 355 also has the added benefit of supporting structural stability of the die package 1005 and the integrated circuit package 200, including maintaining the position of both the die 205 and the die package 1005 within the first cavity 275. In addition, the two-layer core enclosure 355 may reduce stress on the solder joints of various elements in the integrated circuit package 200.

In another example, leaving the inactive side 390 of the die 205 entirely or partially exposed may be beneficial when the inactive side 390 of the die 205, or top of the die 205, generates or receives RF transmissions which may be affected if the die 205 were embedded in the package substrate 225 and substantially covered with the enclosure cover 360.

In an optional embodiment, a second cavity 405 can be formed in at least one of the walls of package substrate 225 bounding the dimensions of the first cavity 275, to create a three-layer core enclosure (355, 410). The second cavity 405 can be a lateral trench that extends the length of the wall. For example, the second cavity 405 can be formed in both a first side of the first cavity 275 and a second side of the first cavity 275. In some embodiments, the first side and the second side may be opposite sides of the first cavity 275 (e.g., a left side and a right side), and each side may be substantially parallel to the other. The second cavity 405 may be filled with the conductive material used in the two-layer core enclosure 355, or any other conductive or semi conductive material to produce a third layer 410 as illustrated in FIG. 4. The third layer 410 may be coupled to the two-layer core enclosure 355. In such a configuration, the third layer 410 operates as an additional passive heat sink to the two-layer core enclosure 355, as well as operating as an additional EMI shield to reduce or eliminate the electromagnetic field in the space surrounding the die 205. The third layer 410 also has the added benefit of providing supplemental structural stability to the integrated circuit package 300, including maintaining the position of both the die 205, the die package 1005, and the two-layer core enclosure 355 within the first cavity 275, as well as reducing stress on the solder joints of both the die 205 and the die package 1005. The second cavity 405 may be formed in the same manner as that of the first cavity 275.

Still referring to FIG. 11, a fourth stage (demarcated with a numeral 4) illustrates the die package 1005 encapsulated in a two-layer core enclosure 355 within the package substrate 225 and covered with the dielectric material 320. The dielectric material 320 is formed over the two-layer core enclosure 355, the vias 335, and the exposed package substrate 225 to provide a planar surface for subsequent layers. In some embodiments, dielectric material 320 is formed of polymer, a nitride, an oxide, or the like. In some embodiments, the dielectric material 320 is formed by a spin-on process.

Still referring to FIG. 11, a fifth stage (demarcated with a numeral 5) illustrates the die package 1005 encapsulated in the two-layer core enclosure 355 within the package substrate 225, coupled to an RDL 315. Generally, the RDL 315 provides a conductive pattern that allows a pin-out contact pattern for a completed package allowing for flexibility in the placement of vias 335 and die 205. The RDL 315 may be utilized to provide an external electrical connection to the die 205 and/or vias 335. The RDL 315 may further be used to electrically couple the die 205 to one or more vias 335, which may be electrically coupled to one or more other packages, package substrates, components, the like, or a combination thereof. For purposes of illustration, two conductive layers 345 are shown extending into and out of the page. However, other embodiments may include additional conductive layers 345, and the conductive layers 345 may extend along any direction. The RDL 315 may be formed using any suitable process. For example, a dielectric layer 370 can be formed on the die package 1005. The dielectric layer 370 can then patterned to form openings to expose the conductive pillars 310 and the vias 335. Other methods, such as using a patterned mask, photolithography, and etching, may also be used to pattern the dielectric layer 370. The RDL 315 provides an electrical connection upon which a BGA 330, or the like, may be coupled.

Still referring to FIG. 11, a sixth stage (demarcated with a numeral 6) illustrates the die package 1005 encapsulated in the two-layer core enclosure 355 within the package substrate 225, including an RDL 315 coupled to the BGA 330. For purposes of illustration, the BGA 330 is shown as an example for coupling the die package 1005 to an external device. However, other embodiments may include metal pillars, controlled collapse chip connection (C4) bumps, micro bumps, electroless nickel-electroless palladium-immersion gold technique (ENEPIG) formed bumps, or a combination thereof, among others.

Figure 12:
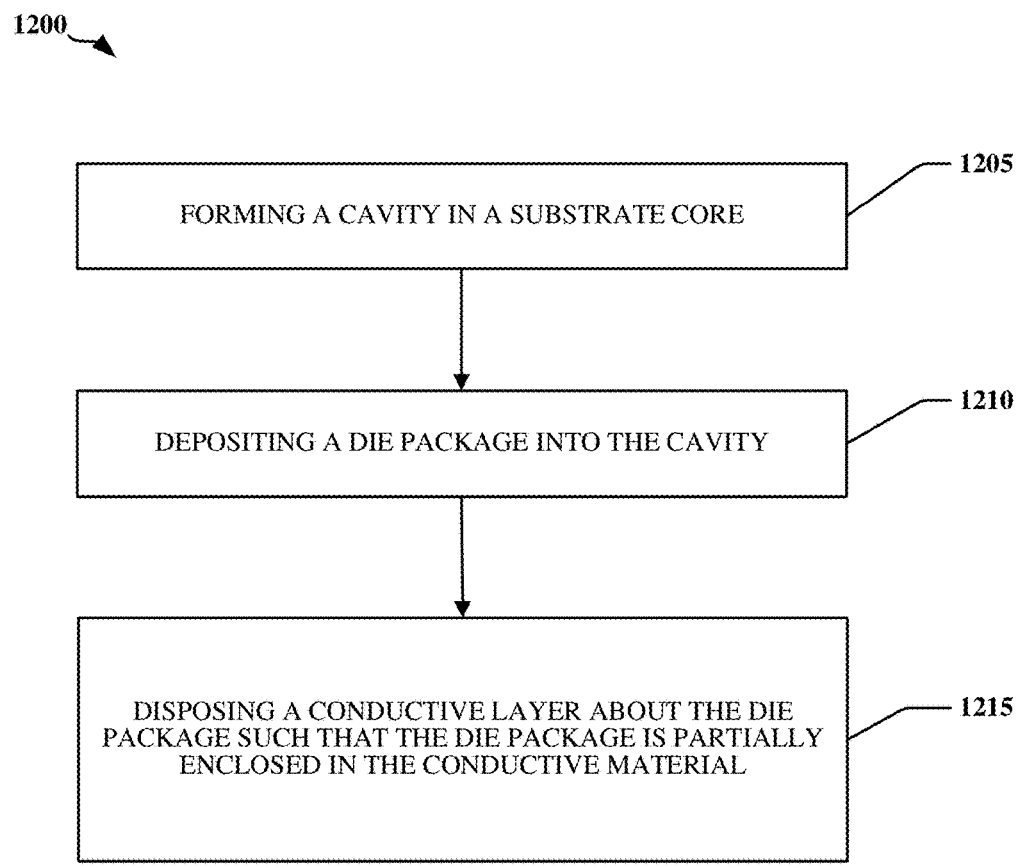
FIG. 12 illustrates a flowchart for an exemplary process for fabricating an integrated circuit package that includes a die embedded in a package substrate.

FIG. 12 illustrates a flowchart for an exemplary process 1200 for fabricating an integrated circuit package that includes a die embedded in a package substrate 225. In at least one of the various examples, at block 1205, a cavity may be formed in the package substrate 225. The cavity may include a first cavity 275, or both a first cavity 275 and a second cavity 405. The package substrate 225 may include one or more layers or package substrate material and have substantially planar first and second surfaces. In one example, a conductive material can be embedded in one or more layers of the package substrate 225. As such, the second cavity 405 may not be necessary because the third layer 410 is built into the package substrate 225. This embodiment has the additional benefit of having the embedded layer of conductive material act as a built-in "stop layer" to aid in the process of forming the first cavity 275. The first cavity 275 may be formed in one of the first or second surfaces of the package substrate 225, and may have a volume that is greater than the volume of a die package 1005. In other words, the die package may be smaller than the first cavity in one or more dimensions so that the die package 1005 can be embedded within the first cavity 275. Optionally, the second cavity 405 may be formed in one or more walls of the first cavity 275. Additional cavities can be formed in the walls of the first cavity 275 such that a layer of package substrate material exists between any of the second cavity 405 and each additional cavity.

At block 1210, in at least one of the various examples, the die package 1005 may be deposited into the first cavity 275. The die package 1005 may be positioned within the first cavity 275 such that a gap exists between one or more walls of the die package 1005 and corresponding walls of the first cavity 275. The die package 1005 may be positioned such that an inactive side 390 of the die package 1005 faces the opening of the first cavity 275, and an active side of the die package 1005 is substantially flush with a floor of the first cavity 275. In one example, the surface of the inactive side 390 of the die package 1005 may be level with the first surface of the package substrate 225. In other examples, the surface of the inactive side 390 of the die package 1005 may be higher or lower than the first surface of the package substrate 225, depending on space requirements.

At block 1215, in at least one of the various examples, a conductive layer forming the two-layer core enclosure 355 may be disposed about the die package 1005 such that the die package 1005 is partially enclosed in the conductive material. As such, the die package 1005 and the conductive material are substantially within the first cavity 275 and/or the second cavity 405 of the package substrate 225. In other words, a difference between the volume of the die package 1005 and the volume of the first cavity 275 may be filled with a first layer of conductive material that couples the die package 1005 to the package substrate. The second layer of conductive material can be formed on top of the first layer and on top of the inactive side 390 of the die package 1005. Optionally, in the case of the package substrate 225 having the first and the second cavities, the conductive layer may form a three-layer core enclosure (355, 410). Here, the third layer 410 of the enclosure may fill the second cavity 405 and the first layer may fill the first cavity 275, thereby coupling the die package 1005 to the package substrate 225.

Exemplary Electronic Devices

Figure 13:
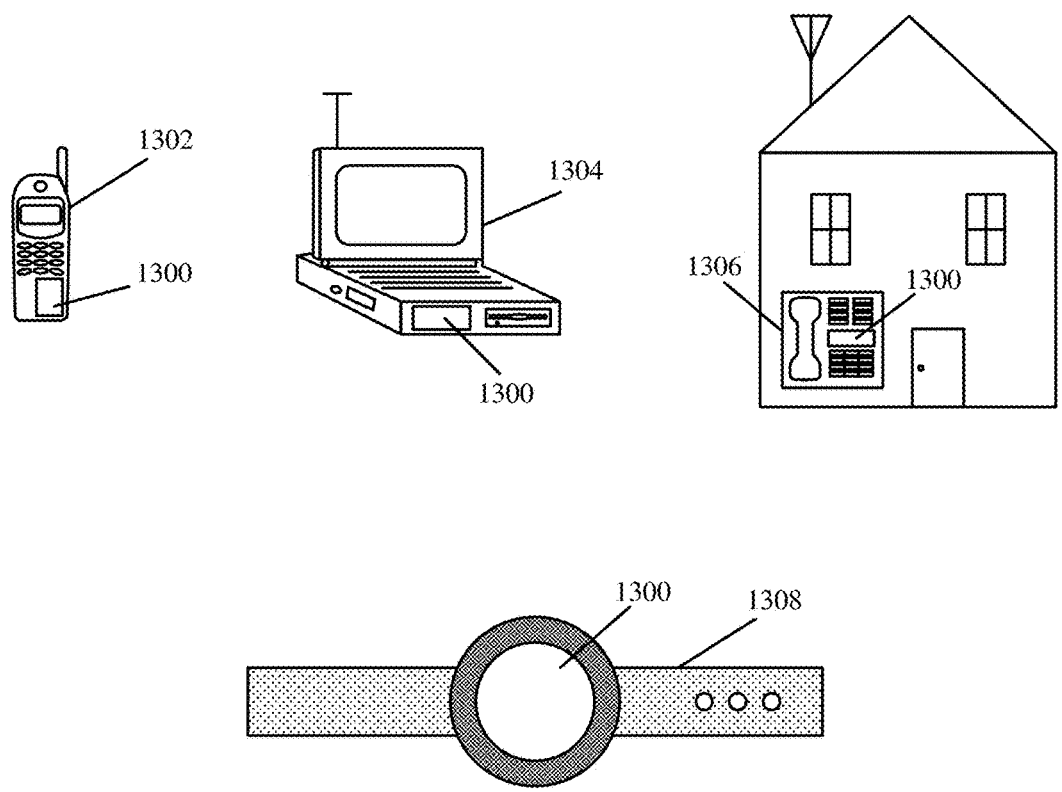
FIG. 13 illustrates various exemplary electronic devices that may include the various integrated devices, integrated device packages, semiconductor devices, dies, integrated circuits, and/or packages described herein.

FIG. 13 illustrates various exemplary electronic devices that may include the various integrated devices, integrated device packages, semiconductor devices, dies, integrated circuits, and/or packages described herein. For example, a mobile phone device 1302, a laptop computer device 1304, a fixed location terminal device 1306, a wearable device 1308 may include an integrated device 1300 as described herein. The integrated device 1300 may be, for example, any of the integrated circuits, dies, integrated devices, integrated device packages, integrated circuit devices, device packages, integrated circuit (IC) packages, package-on-package devices described herein. The devices 1302, 1304, 1306, 1308 illustrated in FIG. 13 are merely exemplary. Other electronic devices may also feature the integrated device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7, 8, 9, 10, and/or 11 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7, 8, 9, 10, and/or 11 and its corresponding description in the present disclosure is not limited to dies and/or ICs. In some implementations, FIGS. 2, 3, 4, 5, 6, 7, 8, 9, 10, and/or 11 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The foregoing disclosed devices and methods may be designed and configured into graphics database system (GDS) and (GDSII) and Gerber computer files and the like, and stored on a computer readable media. These files are in turn provided to fabrication handlers who fabricate devices based on these files. The resulting products are semiconductor wafers that are then cut into semiconductor die and packaged into a semiconductor chip. The chips are then employed in devices as described above.

While the foregoing disclosure shows illustrative embodiments, it should be noted that various changes and modifications could be made herein without departing from the scope of the disclosure as defined by the appended claims. The functions, steps and/or actions of the method claims in accordance with the embodiments described herein need not be performed in any particular order. Furthermore, although elements of embodiments may be described or claimed in the singular, the plural is contemplated unless limitation to the singular is explicitly stated.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package, comprising:
    a package substrate including a first cavity;
    an integrated device including a first active side and an inactive side, and embedded in the first cavity; and
    a structure partially enclosing the integrated device, the structure including a first layer in the first cavity and a second layer,
    wherein the first layer is coupled between the package substrate and the integrated device, and
    wherein the second layer is disposed over the inactive side of the integrated device.

2. The package of claim 1, wherein the first layer and the second layer include a conductive material.

3. The package of claim 2, wherein at least one of the first layer and the second layer is coupled to an electrical ground or a chassis ground.

4. The package of claim 2, wherein the conductive material includes one or more of a copper material or a conductive polymer.

5. The package of claim 1, wherein the integrated device comprises:
    a die having a second active side and the inactive side;
    a plurality of conductive pillars electrically coupled to elements on the second active side of the die and extending perpendicular therefrom; and
    a layer of dielectric material disposed over the second active side of the die and coupled to the plurality of conductive pillars.

6. The package of claim 1, wherein the second layer extends over a first surface of the package substrate, wherein the first surface is outside of the first cavity.

7. The package of claim 1, wherein the first layer is coupled to the second layer.

8. The package of claim 1, wherein the integrated device is embedded in the first cavity such that a gap exists between at least (i) a first side of the integrated device and a corresponding first side of the first cavity and (ii) a second side of the integrated device and a corresponding second side of the first cavity.

9. The package of claim 1, wherein the package substrate includes a prepreg substrate printed circuit board (PCB).

10. The package of claim 1, further comprising:
    a second cavity in at least a first side and a second side of the first cavity; and
    a third layer of conductive material contained within the second cavity.

11. The package of claim 10, wherein the third layer of conductive material is coupled to the first layer.

12. The package of claim 1, further comprising a redistribution layer (RDL) coupled to the first active side of the integrated device.

13. The package of claim 12, wherein the first layer is coupled to at least one of an electrical ground and a chassis ground via a conductive line in the RDL.

14. The package of claim 1, wherein the package substrate further includes a plurality of vias.

15. A package, comprising:
    a package substrate including a first cavity and a second cavity;

an integrated device including an active side and an inactive side, and embedded in the first cavity; and a structure partially enclosing the integrated device, the structure including a first layer, a second layer, and a third layer, wherein the first layer is coupled between the package substrate and the integrated device, wherein the second layer is disposed over the inactive side of the integrated device, and wherein the third layer is embedded in the second cavity.

16. The package of claim 15, wherein the package substrate includes a prepreg substrate printed circuit board (PCB).

17. The package of claim 15, wherein the third layer is coupled to the first layer.

18. The package of claim 15, further comprising a redistribution layer (RDL) coupled to the active side of the integrated device.

19. The package of claim 15, wherein the first layer, the second layer, and the third layer are electrically coupled to at least one of an electrical ground and a chassis ground.

20. A package, comprising:
a package substrate including at least a first cavity;
an integrated device including a first active side and an inactive side, and embedded in the first cavity;
a structure partially enclosing the integrated device, the structure including at least a first layer in the first cavity and a second layer,
wherein the first layer is coupled between the package substrate and the integrated device, and
wherein the second layer is disposed over the inactive side of the integrated device; and
a layer of insulating material disposed between the structure and the integrated device.

21. The package of claim 20, wherein the integrated device comprises:
a die having a second active side and the inactive side;
a plurality of conductive pillars electrically coupled to elements on the second active side of the die and extending perpendicular therefrom; and
a layer of dielectric material disposed over the second active side and coupled to the plurality of conductive pillars, wherein the layer of insulating material is disposed over one or more of the inactive side the plurality of conductive pillars, or the layer of dielectric material.

22. The package of claim 20, wherein the package substrate further comprises a second cavity, and wherein the structure further comprises a third layer contained within the second cavity.

23. The package of claim 22, wherein the third layer is coupled to the first layer.

24. The package of claim 20, further comprising a redistribution layer (RDL) coupled to the first active side of the integrated device.

25. The package of claim 24, wherein the first layer is coupled to at least one of an electrical ground and a chassis ground via a conductive line in the RDL.

26. A method of fabricating a package, the method comprising:
forming a first cavity in a package substrate;
depositing an integrated device into the first cavity, the integrated device having an active side and an inactive side; and
disposing a first layer of conductive material in the first cavity about the integrated device and a second layer of conductive material about the integrated device such that the integrated device is partially enclosed in the conductive material,
wherein the first layer of conductive material is coupled between the package substrate and the integrated device, and
wherein the second layer of conductive material is disposed over the inactive side of the integrated device.

27. The method of claim 26, wherein depositing the integrated device into the first cavity further comprises positioning the integrated device in the first cavity such that a gap exists between at least (i) a first side of the integrated device and a corresponding first side of the first cavity and (ii) a second side of the integrated device and a corresponding second side of the first cavity.

28. The method of claim 27, wherein disposing the first layer of conductive material and the second layer of conductive material about the integrated device further comprises:
depositing a first seed layer over (i) the first side of the integrated device and the corresponding side of the first cavity and (ii) a second side of the integrated device and the corresponding side of the first cavity;
depositing a second seed layer over the inactive side of the integrated device;
forming the first layer of conductive material utilizing the first seed layer; and
forming the second layer of conductive material utilizing the second seed layer.

29. The method of claim 28, wherein the first seed layer and the second seed layer include a conductive metal.

30. The method of claim 26, further comprising:
forming a second cavity in the package substrate of at least a first side and a second side of the first cavity; and
filling the second cavity in the package substrate with a third layer of conductive material.

* * * * *